(12) United States Patent
Nyberg

(10) Patent No.: US 9,863,980 B2
(45) Date of Patent: Jan. 9, 2018

(54) LOOP-POWERED FIELD DEVICE WITH VOLTAGE REGULATOR AND CURRENT SOURCE IN SERIES

(71) Applicant: Rosemount Tank Radar AB, Gothenburg (SE)

(72) Inventor: Hakan Nyberg, Linkoping (SE)

(73) Assignee: Rosemount Tank Radar AB, Gothenburg (SE)

( * ) Notice: Subject to any disclaimer, the term of this patent is extended or adjusted under 35 U.S.C. 154(b) by 306 days.

(21) Appl. No.: 14/719,698

(22) Filed: May 22, 2015

(65) Prior Publication Data

US 2016/0341767 A1  Nov. 24, 2016

(51) Int. Cl.
*G01R 15/00* (2006.01)
*G01R 29/00* (2006.01)
*G01F 23/284* (2006.01)
*G05F 1/46* (2006.01)
*H01Q 1/22* (2006.01)

(52) U.S. Cl.
CPC .......... *G01R 15/00* (2013.01); *G01F 23/284* (2013.01); *G01R 29/00* (2013.01); *G05F 1/46* (2013.01); *H01Q 1/225* (2013.01)

(58) Field of Classification Search
CPC ....... G01F 23/284; G01R 15/00; G01R 29/00; G05F 1/46; H01Q 1/225
USPC ........................................................ 342/124
See application file for complete search history.

(56) References Cited

U.S. PATENT DOCUMENTS

| 5,684,451 | A | * | 11/1997 | Seberger ................ G08C 19/02 |
| | | | | 137/487.5 |
| 6,014,100 | A | * | 1/2000 | Fehrenbach .......... G01F 23/284 |
| | | | | 342/124 |
| 8,477,064 | B2 | | 7/2013 | Nilsson |
| 2007/0152645 | A1 | | 7/2007 | Orth |
| 2008/0174178 | A1 | | 7/2008 | Jakobsson |
| 2012/0162003 | A1 | * | 6/2012 | Nilsson ................. G01F 23/284 |
| | | | | 342/124 |

(Continued)

FOREIGN PATENT DOCUMENTS

| EP | 2733564 A2 | 5/2014 |
| WO | 2012084280 A1 | 6/2012 |

OTHER PUBLICATIONS

International Search Report and the Written Opinion for the International application No. PCT/EP2016/060972 dated Aug. 30, 2016.

*Primary Examiner* — Timothy A Brainard
(74) *Attorney, Agent, or Firm* — Westman, Champlin & Koehler, P.A.

(57) ABSTRACT

The present invention relates to a field device for determining a process variable and providing a measurement signal indicative of the process variable to a remote location via a two-wire current loop. The field device comprises a measurement device for determining the process variable; a current control device electrically connected in series with the measurement device and controllable by the measurement device to provide the measurement signal to the two-wire current loop; and voltage regulation circuitry electrically connected in series with the current control device and the measurement device for controlling a voltage across the current control device towards a desired voltage by varying a voltage across the voltage regulation circuitry.

18 Claims, 3 Drawing Sheets

(56) References Cited

U.S. PATENT DOCUMENTS

2014/0048686 A1\* 2/2014 Johansson ............... H02M 3/07
 250/208.1

\* cited by examiner

LOOP-POWERED FIELD DEVICE WITH VOLTAGE REGULATOR AND CURRENT SOURCE IN SERIES

FIELD OF THE INVENTION

The present invention relates to a field device for determining a process variable and providing a measurement signal indicative of the process variable to a remote location via a two-wire current loop.

BACKGROUND OF THE INVENTION

Field devices are often used in the industry to measure various process variables, such as pressure, temperature, flow or product level. In particular, a radar level gauge system may be used for measuring the level of a product such as a process fluid, a granular compound or another material.

In a radar level gauge system, an electromagnetic transmit signal may be propagated from a transceiver arranged at the top of a tank towards a surface of a product in the tank, and an electromagnetic reflection signal, resulting from reflection of the transmit signal at the surface, returns to the transceiver. Based on the transmit signal and the reflection signal, the distance to the surface of the product can be determined, from which the level of the product in the tank can be deduced.

In many facilities, such as process industrial facilities, where field devices are used, there is existing wiring between the field device and a remote location, such as a host. The existing wiring often forms a two-wire current loop for communication of commands from the host to the field device and a measurement signal indicative of a process variable from the field device to the host. Communication on the two-wire current loop may take place by controlling the current flowing through the loop. In a 4-20 mA loop, the measurement signal may, for example, be the loop current itself. As an alternative or complement to such an analog current level, digital information may be communicated by modulating the loop current, for example using the HART-protocol.

In addition to being able to receive and send signals over the two-wire current loop, the field device may need to be able to operate using electric power drawn from the two-wire current loop. In other words, the field device may be a loop-powered field device.

In some existing solutions for realizing a loop-powered field device, the measurement device for determining the process variable, a current control circuit for providing the measurement signal to the two-wire current loop, and a shunt regulator may all be connected in parallel. However, due to expected variations in the loop voltage, a relatively large portion of the available electrical power on the loop is not used for powering the measurement device in such a solution.

To improve the energy efficiency of a loop-powered field device, U.S. Pat. No. 8,477,064 discloses electrically connecting the current control circuit in series with a converter for converting input power from the current loop to output power to the measurement device, and providing a voltage regulator for keeping the voltage across the current control circuit constant by varying the voltage across the converter. In this way, practically all of the available power on the loop can be used for powering the measurement device, regardless of the loop voltage.

Although the loop-powered field device according to U.S. Pat. No. 8,477,064 provides for very energy efficient operation, there may be room for improvement, in particular concerning the stability of the regulated loop current.

SUMMARY OF THE INVENTION

It is an object of the present invention to address the above, and to provide an improved field device, in particular providing for improved stability of the regulated loop current.

According to a first aspect of the present invention, it is therefore provided a field device for determining a process variable and providing a measurement signal indicative of a value of the process variable to a remote location via a two-wire current loop, the field device comprising: a measurement device for determining the value of the process variable using energy received via the two-wire current loop for operation of the measurement device; a current control device electrically connected in series with the measurement device and being controllable by the measurement device to control a loop current flowing through the two-wire current loop based on the value of the process variable, to thereby provide the measurement signal; and voltage regulation circuitry electrically connected in series with the current control device and the measurement device for controlling a voltage across the current control device towards a desired voltage by varying a voltage across the voltage regulation circuitry.

Since the measurement device, the controllable current source and the voltage regulation circuitry are electrically connected in series, the loop voltage provided to the field device, when in use, corresponds to the sum of the voltages across the measurement device, the controllable current source, the voltage regulation circuitry and any further circuitry connected in series.

By a "field device" should be understood any device that determines a process variable and communicates a measurement signal indicative of that process variable to a remote location. Examples of field devices include devices for determining process variables such as filling level, temperature, pressure, fluid flow etc.

As was also mentioned in the Background section, the measurement signal may, for example, be a constant current and/or a time-varying current superimposed on a constant current. Such a time-varying current may modulate digital information, for example according to the HART communication protocol.

The measurement device may comprise a power converter for converting an input power from the two-wire current loop to an output power for powering measurement circuitry comprised in the measurement device. Such a power converter may be configured to convert an input voltage across input terminals of the power converter to an output voltage across output terminals of the power converter.

The present invention is based on the realization that a favorable trade-off between stable current regulation and utilization of the power available on the current loop can be achieved by arranging a voltage regulator in series with the controllable current source and the measurement device, and configuring the voltage regulator to control the voltage across the controllable current source towards a desired voltage by varying a voltage drop across the voltage regulator.

In embodiments of the field device according to the present invention, variation of the voltage across the measurement device can hereby be reduced, while still allowing the measurement device to access the full loop current. This, in turn, provides for a more stable control, by the measurement device, of the controllable current source.

Furthermore, since the voltage regulator is connected in series with the controllable current source and the measurement device, the voltage regulator can be configured to at least partly prevent external disturbances from propagating into the controllable current source.

To that end, the voltage regulator may be configured vary the voltage drop across the voltage regulator very quickly, so that the voltage regulator is capable of regulating the voltage across the controllable current source also in the presence of high frequency variations in the loop voltage. The field device and/or the two-wire current loop may be provided with conventional capacitor based EMI-filters for blocking very high frequency interference signals, such as RF frequency interference. The lowest frequency blocked by such capacitor based EMI-filters will depend on the capacitance. With a higher capacitance, lower frequency signals can be blocked. However, there may be a limit to the allowed capacitance, in particular in applications in which explosive or flammable substances may be present. For instance, the field device as well as the current loop itself may need to fulfil the requirements for intrinsic safety. To provide for an improved blocking of interference voltage signals also in such applications, the voltage regulator may advantageously be configured to vary the voltage drop across the voltage regulator sufficiently fast (with a sufficiently short time constant) to block interference signals at least up to the above-mentioned lowest frequency blocked by a capacitor based EMI-filter for use in an application requiring intrinsic safety.

Thus, in embodiments of the field device according to the present invention, the voltage regulation circuitry may be arranged and configured to vary the voltage across the voltage regulation circuitry in such a way that disturbance signals at least in the frequency range from about 10 kHz to about 100 kHz are suppressed by the voltage regulation circuitry.

In other words, the voltage regulation circuitry can be said to be arranged and configured to function as a filter preventing voltage variations at least in a frequency range from about 10 kHz to about 100 kHz from propagating through the voltage regulation circuitry.

It is expected that configuring the voltage regulation circuitry to block at least this frequency range (10 kHz-100 kHz) will allow the design of an EMI-filter that fulfils the requirements on intrinsic safety, while still sufficiently suppressing disturbances.

In order to facilitate the design of the EMI-filter, the voltage regulation circuitry may advantageously be configured to suppress disturbance signals at least in a frequency range from about 10 kHz to about 1 MHz.

In the low end of the frequency ranges discussed so far, the current control device can be designed to correctly control the loop current also in the presence of disturbances with frequencies up to about 10 kHz.

However, by arranging and configuring the voltage regulation circuitry to block disturbance signals with frequencies down to about 0 Hz (DC), the design of the current control device may be facilitated and there is a potential for cost savings.

Hence, the voltage regulation circuitry may advantageously be configured to suppress disturbance signals at least in a frequency range from about 0 Hz to about 100 kHz or, even more advantageously, 1 MHz.

To provide for further improved disturbance suppression properties of the field device according to embodiments of the present invention, the controllable current source may be electrically connected between the voltage regulation circuitry and the measurement device.

In these embodiments, the input voltage to the controllable current source may be controlled by the voltage regulation circuitry and the voltage regulation circuitry may be able to at least partly prevent external disturbances from reaching the controllable current source.

According to various embodiments, the voltage regulation circuitry may be configured to vary the voltage across the voltage regulation circuitry by varying an impedance of the voltage regulation circuitry. For instance, to provide for a simple and self-regulating circuit, the voltage regulation circuitry may advantageously comprise a depletion mode N-channel MOSFET, which may function to suppress high frequency disturbance signals, by quickly changing the impedance between the drain and source terminals of the depletion mode N-channel MOSFET. It should be understood, however, that one of ordinary skill in the art will be capable of implementing the voltage regulation using various other, per se known, voltage regulators, such as a PID-regulator.

According to various embodiments, the field device of the present invention may further comprise a current regulator including loop current measurement circuitry for measuring a loop current flowing through the two-wire current loop. The current regulator may be connected to the controllable current source and to the measurement device, for receiving a signal indicative of the process variable from the measurement device and providing a current control signal to the controllable current source based on the measured loop current and the signal from the measurement device.

The loop current measurement circuitry may, for example, be provided in the form of a resistor connected in series with the controllable current source, and voltage measurement circuitry for measuring the voltage drop across the resistor.

According to various embodiments, the loop powered field device may advantageously further comprise a shunt regulator electrically connected in parallel with the measurement device, for keeping an input voltage from the two-wire current loop to the measurement device at or below a predefined regulated voltage. The shunt regulator may comprise a reverse biased zener diode.

In embodiments, the field device of the present invention, may further comprise a first loop connector for connection to a relatively high loop potential and a second loop connector for connection to a relatively low loop potential. The measurement device, the controllable current source, and the voltage regulation circuitry may be electrically connected in series between the first loop connector and the second loop connector.

Advantageously, the voltage regulation circuitry may be electrically connected between the first loop connector and the controllable current source; and the measurement device may be electrically connected between the controllable current source and the second loop connector.

According to various embodiments, the field device may further comprise a rechargeable energy storage device. Through the provision of such an energy storage device, a temporary surplus of energy can be stored and used later when the power required for operation of the measurement device is higher than what can be drawn from the two-wire current loop. The energy storage device may, for example, comprise a capacitor, a super-capacitor and/or a rechargeable battery or any other device capable of storing electrical energy.

The rechargeable energy storage device may also be useful in the event of a temporary loss of power.

The field device may additionally be provided with a wireless transmitter for wireless communication of the measurement signal, and the field device may be configured to automatically switch to wireless communication in the case of a temporary loss of power. For example, in embodiments processing circuitry comprised in the measurement device may be programmed to sense a loss of power via the two-wire current loop, and switch to wireless communication when sending a loss of power via the two-wire current loop.

The field device according to embodiments of the present invention may advantageously be a radar level gauge for determining a filling level of a product in a tank, the radar level gauge comprising: a transceiver for generating, transmitting and receiving electromagnetic signals; a propagating device connected to the transceiver for propagating an electromagnetic transmit signal from the transceiver towards a surface of the product and for returning to the transceiver an electromagnetic reflection signal resulting from reflection of the transmit signal at the surface; and processing circuitry for determining the filling level based on the transmit signal and the reflection signal, and for controlling the current control device to provide the measurement signal being indicative of the filling level.

The processing circuitry may be configured to control the transceiver to perform a plurality of measurement cycles, each measurement cycle including: an active time period in which the transceiver generates, transmits and receives the electromagnetic signals; and an inactive time period in which the transceiver does not generate, transmit and receive the electromagnetic signals.

The processing circuitry may be configured to determine, for each measurement cycle in the plurality of measurement cycles, a ratio between a time duration of the active time period and a time duration of the inactive time period, based on the determined filling level.

The ratio may be determined to be lower for a filling level corresponding to relatively small loop current than for a filling level corresponding to a relatively large loop current.

Since the field device, such as the above-mentioned radar level gauge, controls the controllable current source to provide the measurement signal to the two-wire current loop, the field device will in principle know how much current will be available for the measurement device at any given time. As a consequence, the field device may comprise processing circuitry for controlling operation of the measurement device depending on the loop current corresponding to the determined process variable.

When, for instance, the determined process variable corresponds to a relatively large loop current, the measurement device may be controlled to momentarily increase its current consumption, for example by decreasing the time between consecutive measurements. Analogously, the measurement device may reduce its current consumption when the determined process variable corresponds to a relatively small loop current, for example by increasing the time between consecutive measurements.

According to a second aspect of the present invention, it is provided a method of providing a measurement signal via a two-wire current loop using a field device comprising: a measurement device for determining a value of a process variable using energy received via the two-wire current loop for operation of the measurement device; a current control device electrically connected in series with the measurement device and being controllable by the measurement device to control a loop current flowing through the two-wire current loop; and voltage regulation circuitry electrically connected in series with the controllable current control device and the measurement device, wherein the method comprises the steps of: controlling, by the voltage regulation circuitry, a voltage across the current control device towards a desired voltage; and controlling, by the measurement device, the current control device to control the loop current based on the value of the process variable to thereby provide the measurement signal via the two-wire current loop.

According to various embodiments of the present invention, the step of controlling the voltage across the current control device may advantageously comprise the steps of: sensing, by the voltage regulation circuitry, the voltage across the current control circuitry; and varying an impedance of the voltage regulation circuitry based on the sensed voltage.

Further effects and variations of the present second aspect of the invention are largely similar to those described above with reference to the first aspect of the invention.

In summary, the present invention thus relates to a field device for determining a process variable and providing a measurement signal indicative of the process variable to a remote location via a two-wire current loop. The field device comprises a measurement device for determining the process variable; a current control device electrically connected in series with the measurement device and controllable by the measurement device to provide the measurement signal to the two-wire current loop; and voltage regulation circuitry electrically connected in series with the current control device and the measurement device for controlling a voltage across the current control device towards a desired voltage by varying a voltage across the voltage regulation circuitry.

BRIEF DESCRIPTION OF THE DRAWINGS

These and other aspects of the present invention will now be described in more detail, with reference to the appended drawings showing example embodiments of the invention, wherein.

DETAILED DESCRIPTION OF EXAMPLE EMBODIMENTS

In the present detailed description, an exemplary embodiment of the field device according to the present invention is discussed with reference to a non-contact radar level gauge system. It should be noted that this by no means limits the scope of the present invention, which is equally applicable to other field devices, such as guided wave radar level gauge systems, temperature sensors, pressure sensors, etc. Moreover, the two-wire current loop may be configured to function according to various communication standards, such as 4-20 mA, HART, Foundation Fieldbus, Profibus etc.

Figure 1:
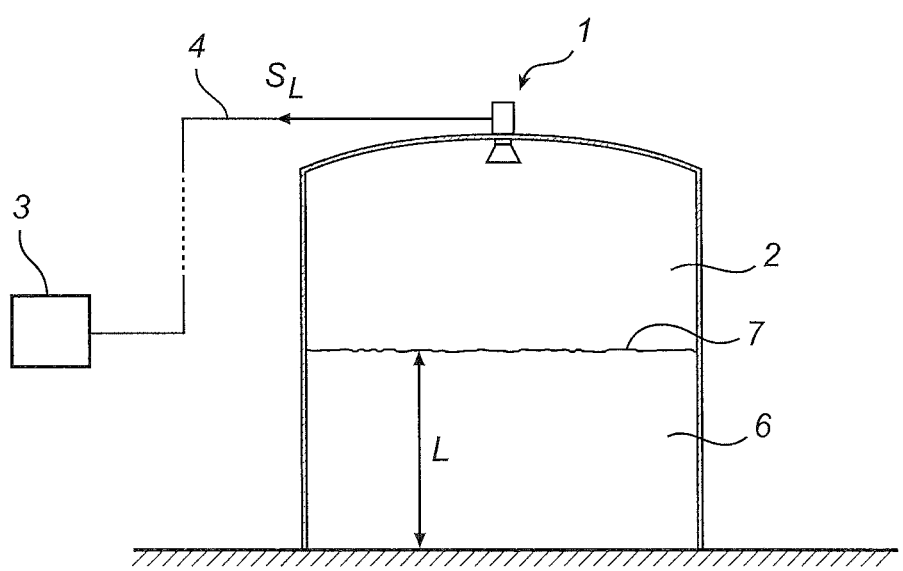
FIG. 1 schematically illustrates a field device, in the form of a radar level gauge installed in an exemplary tank.

FIG. 1 schematically illustrates a field device in the form of a radar level gauge 1 installed in an exemplary tank 2. The radar level gauge 1 is connected to a remote host/master 3 via a two-wire current loop 4, which is also used to provide power to the radar level gauge 1. The tank 2 contains a product 6, and when in operation, the radar level gauge 1 determines the filling level L of the product 6 in the tank 2 based on an electromagnetic transmit signal propagated towards the surface 7 of the product 6 and an electromagnetic reflection signal resulting from reflection of the transmit signal at the surface 7.

After having determined the filling level L, which is an example of a process variable, the radar level gauge provides a measurement signal $S_L$ indicative of the filling level L to the remote host/master 3 via the two-wire current loop 4. The provision of the measurement signal $S_L$ to the two-wire current loop 4, as well as the provision of power from the two-wire current loop 4 to the field device 1 will be described in more detail below with reference to FIG. 2.

Figure 2:
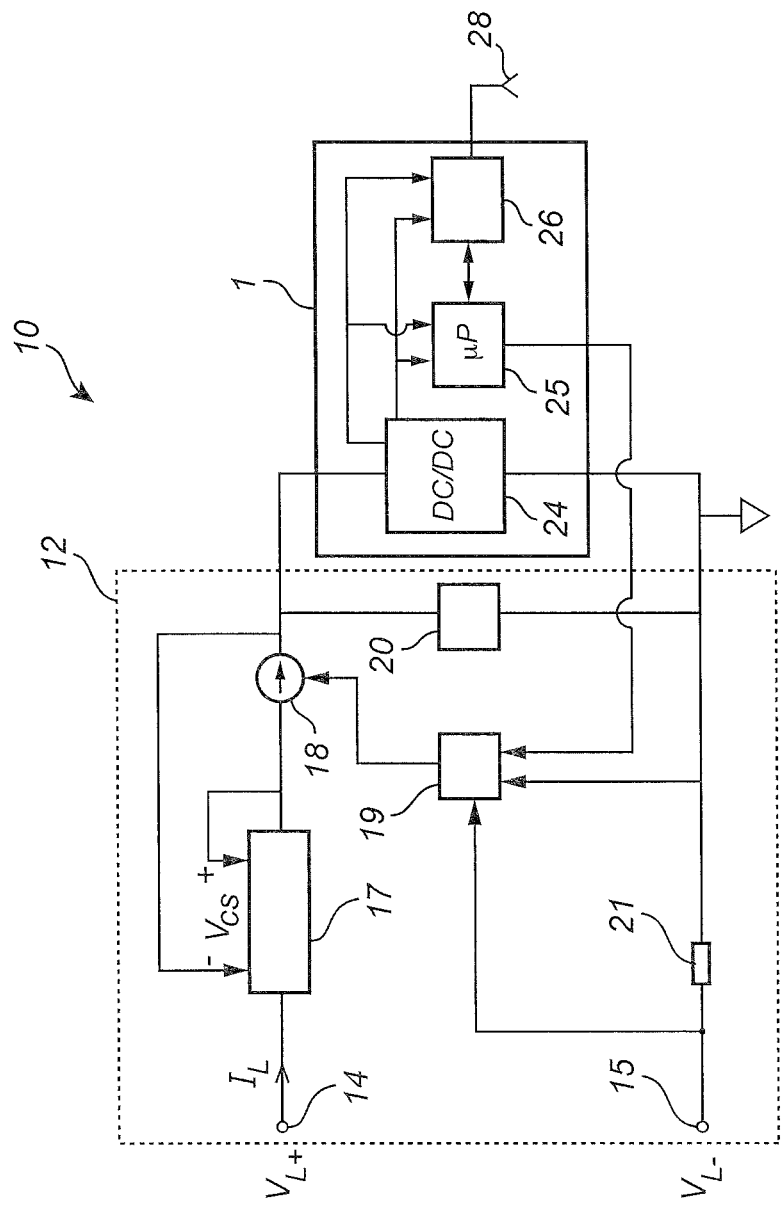
FIG. 2 is a block diagram schematically illustrating an exemplary embodiment of the field device according to the present invention, in the form of a radar level gauge.

FIG. 2 is a block diagram schematically illustrating an exemplary embodiment of the field device according to the present invention, such as the radar level gauge 1 in FIG. 1.

The field device 10 in FIG. 2 comprises a measurement device, here in the form of radar level gauge 1 for determining the above-mentioned filling level L, and loop interface circuitry 12 for providing a measurement signal $S_L$ (the loop current $I_L$) indicative of the process variable to the two-wire current loop 4, and for providing power from the two-wire current loop 4 to the measurement device 1.

The loop interface circuitry 12 comprises a first loop connector 14 for connection to a relatively high loop potential $V_{L+}$, and a second loop connector 15 for connection to a relatively low loop potential $V_{L-}$. As can be seen in FIG. 2, the loop interface circuitry 12 further comprises a voltage regulator 17, a controllable current source 18, a current regulator 19, a shunt regulator 20, and a measurement resistor 21.

Starting from the first loop connector 14, the voltage regulator 17, the controllable current source 18, the measurement device 1, and the measurement resistor 21 are connected in series, and form part of the two-wire current loop 4 when the field device 10 is connected to the current loop at the first 14 and second 15 loop connectors.

As is indicated in FIG. 2, the current regulator 19 is arranged to measure the voltage across the measurement resistor 21 to thereby determine the loop current $I_L$, and is further connected to the measurement device 1 for receiving a signal indicative of a desired loop current representing a process variable (such as filling level L) determined by the measurement device 1, and to the controllable current source 18 for controlling the current source 18 to provide the desired loop current $I_L$.

The shunt regulator 20, which may for example be provided by a zener diode, is connected in parallel with the measurement device 1 to further reduce variations in the input voltage to the measurement device 1. This will allow an even more stable regulation of the loop current $I_L$.

The radar level gauge 1 comprises a DC/DC converter 24, processing circuitry indicated as a microprocessor 25, and a microwave unit 26. The microwave unit 26 is connected to a propagation device, here indicated as a schematic antenna 28 for transmitting and receiving microwave signals.

The DC/DC converter 24 is connected to the loop interface circuitry 12 for receiving power from the two-wire current loop 4. As is indicated in FIG. 2, the DC/DC converter 24 provides power to the processing circuitry 25 and to the microwave unit 26. The processing circuitry 25 controls operation of the microwave unit 26, and determines the filling level L of the product 6 in the tank 2 (referring to FIG. 1) based on the microwave signals transmitted towards the surface 7 and the microwave signals reflected from the surface 7. Additionally, the processing circuitry 25 determines a desired loop current corresponding to the filling level and provides a signal indicative of this desired loop current to the current regulator 19 as is indicated in FIG. 2.

To maintain the controllable current source 18 at a suitable working point, the voltage regulator 17 controls the voltage across the controllable current source 18 towards a desired voltage $V_{cs}$. In order to keep the input voltage to the measurement device 1 stable, the voltage regulator 17 is configured to control the voltage $V_{cs}$ across the controllable current source 18 by varying the voltage drop across the voltage regulator 17, for example by varying an impedance of the voltage regulator 17. Furthermore, the voltage regulator 17 may be configured to vary the voltage drop across the voltage regulator 17 sufficiently quickly to prevent disturbances from passing the voltage regulator 17 from the current loop 4 and into the field device 10.

An example embodiment of the voltage regulator 17 comprised in the field device 10 will now be described with reference to FIG. 3.

Figure 3:
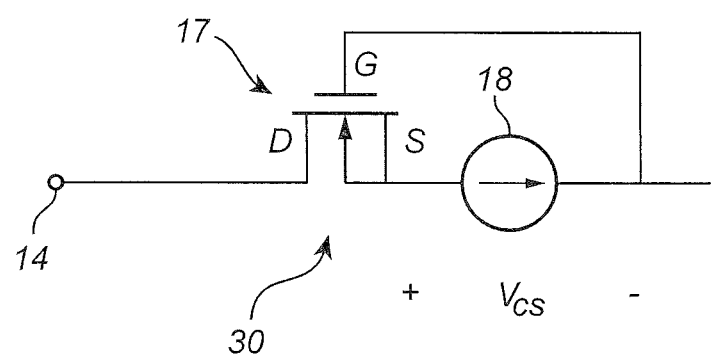
FIG. 3 schematically illustrates exemplary voltage regulation circuitry comprising a depletion mode N-channel MOSFET.

FIG. 3 schematically shows an example of a simple voltage regulator 18 suitable for the field device according to embodiments of the present invention. Referring to FIG. 3, a depletion mode N-channel MOSFET 30 is arranged with its drain 'D' connected to the first loop connector 14, its source 'S' connected to the high potential side of the controllable current source 17, and its gate 'G' connected to the low potential side of the controllable current source 18. As is clear from FIG. 3, the voltage $V_{cs}$ across the controllable current source 18 is equal to $-V_{GS}$ (the voltage between the gate and the source) of the depletion mode N-channel MOSFET 30. If, for example, $V_{cs}$ should increase, $V_{GS}$ becomes more negative, which will result in a increased drain-source impedance of the N-channel MOSFET 30. The increased drain-source impedance results in a larger voltage drop across the depletion mode N-channel MOSFET 30, which in turn results in a reduced voltage $V_{cs}$ across the controllabe current source 18. In addition to being simple and self-regulating, the depletion mode N-channel MOSFET 30 is also very fast, which makes this component highly suitable for use as the voltage regulator 17 of the field device 10 according to embodiments of the present invention.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A field device for determining a process variable and providing a measurement signal indicative of a value of said process variable to a remote location via a two-wire current loop, said field device comprising:

a measurement device for determining the value of said process variable using energy received via said two-wire current loop for operation of said measurement device;

a current control device electrically connected in series with said measurement device and being controllable by said measurement device to control a loop current flowing through said two-wire current loop based on the value of said process variable, to thereby provide said measurement signal; and voltage regulation circuitry electrically connected in series with said current control device and said measurement device for controlling a voltage across said current control device towards a desired voltage by varying a voltage across said voltage regulation circuitry.

2. The field device according to claim 1, wherein said current control device is electrically connected between said voltage regulation circuitry and said measurement device.

3. The field device according to claim 1, wherein said voltage regulation circuitry comprises a voltage sensing input connected to sense said voltage across said current control device, said voltage regulation circuitry being arranged and configured to control the voltage across said voltage regulation circuitry based on said sensed voltage across said current control device.

4. The field device according to claim 1, wherein said voltage regulation circuitry is configured to vary said voltage across said voltage regulation circuitry by varying an impedance of said voltage regulation circuitry.

5. The field device according to claim 4, wherein said voltage regulation circuitry comprises a depletion mode N-channel MOSFET having a gate, a drain and a source,
wherein said source and said gate are connected to said current control device in such a way that a potential difference between said source and said gate follows the voltage across said current control device.

6. The field device according to claim 1, wherein said voltage regulation circuitry is arranged and configured to vary the voltage across said voltage regulation circuitry in such a way that disturbance signals at least in the frequency range from about 10 kHz to about 100 kHz are suppressed by said voltage regulation circuitry.

7. The field device according to claim 1, further comprising a current regulator including loop current measurement circuitry for measuring a loop current flowing through said two-wire current loop,
said current regulator being connected to said current control device and to said measurement device, for receiving a signal indicative of the value of said process variable from said measurement device and providing a current control signal to said current control device based on said measured loop current and said signal from said measurement device.

8. The field device according to claim 1, further comprising a shunt regulator electrically connected in parallel with said measurement device, for keeping a voltage across said measurement device at or below a predefined regulated voltage.

9. The field device according to claim 8, wherein said shunt regulator comprises a zener diode electrically connected in parallel with said measurement device in such a way that said zener diode is reverse biased.

10. The field device according to claim 1, further comprising a first loop connector for connection to a relatively high loop potential of said current loop and a second loop connector for connection to a relatively low loop potential of said current loop,
wherein said measurement device, said current control device, and said voltage regulation circuitry are electrically connected in series between said first loop connector and said second loop connector.

11. The field device according to claim 10, wherein:
said voltage regulation circuitry is electrically connected between said first loop connector and said current control device; and
said measurement device is electrically connected between said current control device and said second loop connector.

12. The field device according to claim 1, further comprising a rechargeable energy storage device,
said rechargeable energy storage device being arranged to be charged using energy received via said two-wire current loop, and being connected to said measurement device for at least intermittently providing electrical energy for operation of said measurement device.

13. The field device according to claim 1, wherein said field device is a radar level gauge for determining a filling level of a product in a tank, said radar level gauge comprising:
a transceiver for generating, transmitting and receiving electromagnetic signals;
a propagating device connected to said transceiver for propagating an electromagnetic transmit signal from said transceiver towards a surface of said product and for returning to said transceiver an electromagnetic reflection signal resulting from reflection of said transmit signal at said surface; and
processing circuitry for determining said filling level based on said transmit signal and said reflection signal, and for controlling said current control device to provide said measurement signal being indicative of the filling level.

14. The field device according to claim 13, wherein said processing circuitry is configured to control said transceiver to perform a plurality of measurement cycles, each measurement cycle including:
an active time period in which said transceiver generates, transmits and receives said electromagnetic signals; and
an inactive time period in which said transceiver does not generate, transmit and receive said electromagnetic signals.

15. The field device according to claim 14, wherein said processing circuitry is configured to determine, for each measurement cycle in said plurality of measurement cycles, a ratio between a time duration of said active time period and a time duration of said inactive time period, based on said determined filling level.

16. The field device according to claim 15, wherein said ratio is determined to be lower for a filling level corresponding to relatively small loop current than for a filling level corresponding to a relatively large loop current.

17. A method of providing a measurement signal via a two-wire current loop using a field device comprising:
a measurement device for determining a value of a process variable using energy received via said two-wire current loop for operation of said measurement device;
a current control device electrically connected in series with said measurement device and being controllable by said measurement device to control a loop current flowing through said two-wire current loop; and
voltage regulation circuitry electrically connected in series with said controllable current control device and said measurement device,
wherein said method comprises the steps of:
controlling, by said voltage regulation circuitry, a voltage across said current control device towards a desired voltage; and controlling, by said measurement device, said current control device to control said loop current based on the value of said process variable to thereby provide said measurement signal via the two-wire current loop.

18. The method according to claim 17, wherein said step of controlling the voltage across said current control device comprises the steps of:

sensing, by said voltage regulation circuitry, the voltage across said current control circuitry; and varying an impedance of said voltage regulation circuitry based on said sensed voltage.

* * * * *